United States Patent
Kim et al.

(10) Patent No.: US 8,149,639 B2
(45) Date of Patent: Apr. 3, 2012

(54) TEST APPARATUS OF SEMICONDUCTOR INTEGRATED CIRCUIT AND METHOD USING THE SAME

(75) Inventors: Jong-Sam Kim, Ichon (KR); Kwang-Jun Cho, Ichon (KR)

(73) Assignee: Hynix Semiconductor, Inc. (KR)

( * ) Notice: Subject to any disclaimer, the term of this patent is extended or adjusted under 35 U.S.C. 154(b) by 0 days.

(21) Appl. No.: 12/941,874

(22) Filed: Nov. 8, 2010

(65) Prior Publication Data

US 2011/0050271 A1  Mar. 3, 2011

Related U.S. Application Data

(62) Division of application No. 12/170,270, filed on Jul. 9, 2008, now Pat. No. 7,843,748.

(51) Int. Cl.
*G11C 29/00* (2006.01)
*G11C 7/00* (2006.01)

(52) U.S. Cl. .................................. 365/201; 365/225.7

(58) Field of Classification Search .................. 365/201, 365/225.7
See application file for complete search history.

(56) References Cited

U.S. PATENT DOCUMENTS

| | | | |
|---|---|---|---|
| 5,818,249 A | 10/1998 | Momohara | |
| 6,667,916 B2 | 12/2003 | Kyung | |
| 7,212,019 B2 | 5/2007 | Schneegans et al. | |
| 7,395,475 B2 * | 7/2008 | Do | 714/734 |
| 7,525,863 B2 | 4/2009 | Park | |
| 7,623,403 B2 | 11/2009 | Cha et al. | |
| 7,761,757 B2 * | 7/2010 | Yun et al. | 714/724 |
| 2009/0003101 A1 | 1/2009 | Yun et al. | |

FOREIGN PATENT DOCUMENTS

| | | |
|---|---|---|
| JP | 2005-333128 | 12/2005 |
| JP | 2006-343113 | 12/2006 |
| JP | 2007-003252 | 1/2007 |
| KR | 100195976 | 2/1999 |
| KR | 1020070003039 A | 1/2007 |
| KR | 1020070036629 A | 4/2007 |

* cited by examiner

*Primary Examiner* — VanThu Nguyen
(74) *Attorney, Agent, or Firm* — Baker & McKenzie LLP

(57) ABSTRACT

A test apparatus includes a test fuse unit for generating a test fuse signal in response to a test mode signal during a test time and generating a test fuse signals according to a fuse cutting after a termination of the test time, a combination signal generating unit for storing a test signal and inactivating a combination signal when the test mode signal is inactivate and for outputting the stored test signal as the combination signal when the test mode signal is activate, and a code signal generating unit for activating a test code signal when one of the test fuse signal and the combination signal is activated.

16 Claims, 5 Drawing Sheets

TEST APPARATUS OF SEMICONDUCTOR INTEGRATED CIRCUIT AND METHOD USING THE SAME

CROSS-REFERENCES TO RELATED APPLICATION

This is a division of application Ser. No. 12/170,270, filed Jul. 9, 2008, titled "TEST APPARATUS OF SEMICONDUCTOR INTEGRATED CIRCUIT AND METHOD USING THE SAME," which is incorporated herein by reference in its entirety as if set forth in full, and which claims priority under 35 U.S.C. 119(a) to Korean Patent Application 10-2008-0003808, filed in the Korean Intellectual Property Office on Jan. 14, 2008, the disclosure of which is incorporated herein by reference in its entirety as if set forth in full.

BACKGROUND

1. Technical Field

The embodiments described herein relate to a semiconductor integrated circuit and, more particularly, to a test apparatus of a semiconductor integrated circuit and a method for using the same.

2. Related Art

After manufacturing semiconductor integrated circuits based on a design technology, they are tested to confirm whether the circuit features of the manufactured products satisfy the requirement set up in the design. The semiconductor integrated circuits are tested in a test mode using a test apparatus.

As shown in FIG. 1, a conventional test apparatus 30 for the semiconductor integrated circuit includes a fuse signal generating unit 10 and a signal combination unit 20.

The fuse signal generating unit 10 generates a fuse signal 'fuse_s' according to whether the fuse is cut. For example, when the fuse is not cut, the fuse signal 'fuse_s' is output at a high level and, when the fuse is cut, the fuse signal 'fuse_s' is output at a low level.

When a test mode signal 'TM' is activated, the signal combination unit 20 generates a test code signal 'test_code' in response to a test signal 'test'. When the test mode signal 'TM' is deactivated, the signal combination unit 20 generates the test code signal 'test_code' in response to the fuse signal 'fuse_s'. That is, in a conventional semiconductor integrated circuit, the test code signal 'test_code' is generated in response to the test signal 'test' when the test mode signal 'TM' is activated, and the test code signal 'test_code' based on whether the fuse is cut after the completion of the test is generated.

As shown in FIG. 2, in a conventional system, a conventional test apparatus includes a first test mode circuit 40 and a second test mode circuit 50. For convenience in illustration, two test mode circuits are shown; however, more or less test mode circuits can be used.

The first test mode circuit 40 can be provided, for example, to execute a first test mode and can include first to fourth test apparatuses 30_1 to 30_4. Each of the first to fourth apparatuses 30_1 to 30_4 can be the same as the test apparatus of FIG. 1. Accordingly, when a first test mode signal 'TM1' is activated, the first test mode circuit 40 generates first to fourth test code signals 'test_code1' to 'test_code4' in response to first to fourth test signals "test1-1" to "test1-4", respectively. Meanwhile, when the first test mode signal 'TM1' is deactivated, the first test mode circuit 40 generates the first to fourth test code signals 'test_code1' to 'test_code4' according to whether the fuses included in the first to fourth test apparatuses 30_1 to 30_4 are cut.

Different kinds of tests (16 types) can be executed in the first test mode by decoding the first to fourth test code signals 'test_code1' to 'test_code4'.

The second test mode circuit 50 can be provided to execute a second test mode and can include fifth to eighth test apparatuses 30_5 to 30_8. Each of the fifth to eighth test apparatuses 30_5 to 30_8 can be the same as the test apparatus of FIG. 1. Accordingly, when a second test mode signal 'TM2' is activated, the second test mode circuit 50 generates fifth to eighth test code signals 'test_code5' to 'test_code8' in response to fifth to eighth test signals "test2'-1" to "test2'-4". Meanwhile, when the second test mode signal 'TM2' is deactivated, the second test mode circuit 50 generates the fifth to eighth test code signals 'test_code5' to 'test_code8' according to whether the fuses included in the fifth to eighth test apparatuses 30_5 to 30_8 are cut.

Different kinds of tests (16 types) can also be executed in the second test mode by decoding the fifth to eighth test code signals 'test_codes' to 'test_code8'.

As mentioned above, a conventional semiconductor integrated circuit includes a plurality of test apparatuses capable of carrying out, e.g., sixteen kinds of tests in one test mode. For example, when a conventional semiconductor integrated circuit executes testing operations based on ten test modes, it is required to provide ten test apparatuses that each can execute sixteen kinds of tests in one test mode. Therefore, forty test signals are needed in total, because four test signals are input into each of the test apparatuses. That is, in a conventional semiconductor integrated circuit, the greater the number of test modes, the greater the number of test signals that are needed to perform all the test available.

Accordingly, in a conventional semiconductor integrated circuit, the signal lines needed to transmit the test signals occupy a large area, which reduces area-efficiency.

SUMMARY

A test apparatus of a semiconductor integrated circuit capable of executing a plurality test modes using a fixed number of test signals is described herein.

According to one aspect, a semiconductor integrated circuit comprises a test fuse unit for generating a test fuse signal in response to a test mode signal during a test time and generating a test fuse signal according to a fuse cutting after a termination of the test time, a combination signal generating unit for storing a test signal and deactivating a combination signal when the test mode signal is deactivated and for outputting the stored test signal as the combination signal when the test mode signal is activated, and a code signal generating unit for activating a test code signal when one of the test fuse signal and the combination signal is activated.

These and other features, aspects, and embodiments are described below in the section "Detailed Description."

BRIEF DESCRIPTION OF THE DRAWINGS

Features, aspects, and embodiments are described in conjunction with the attached drawings, in which.

DETAILED DESCRIPTION

Figure 1:
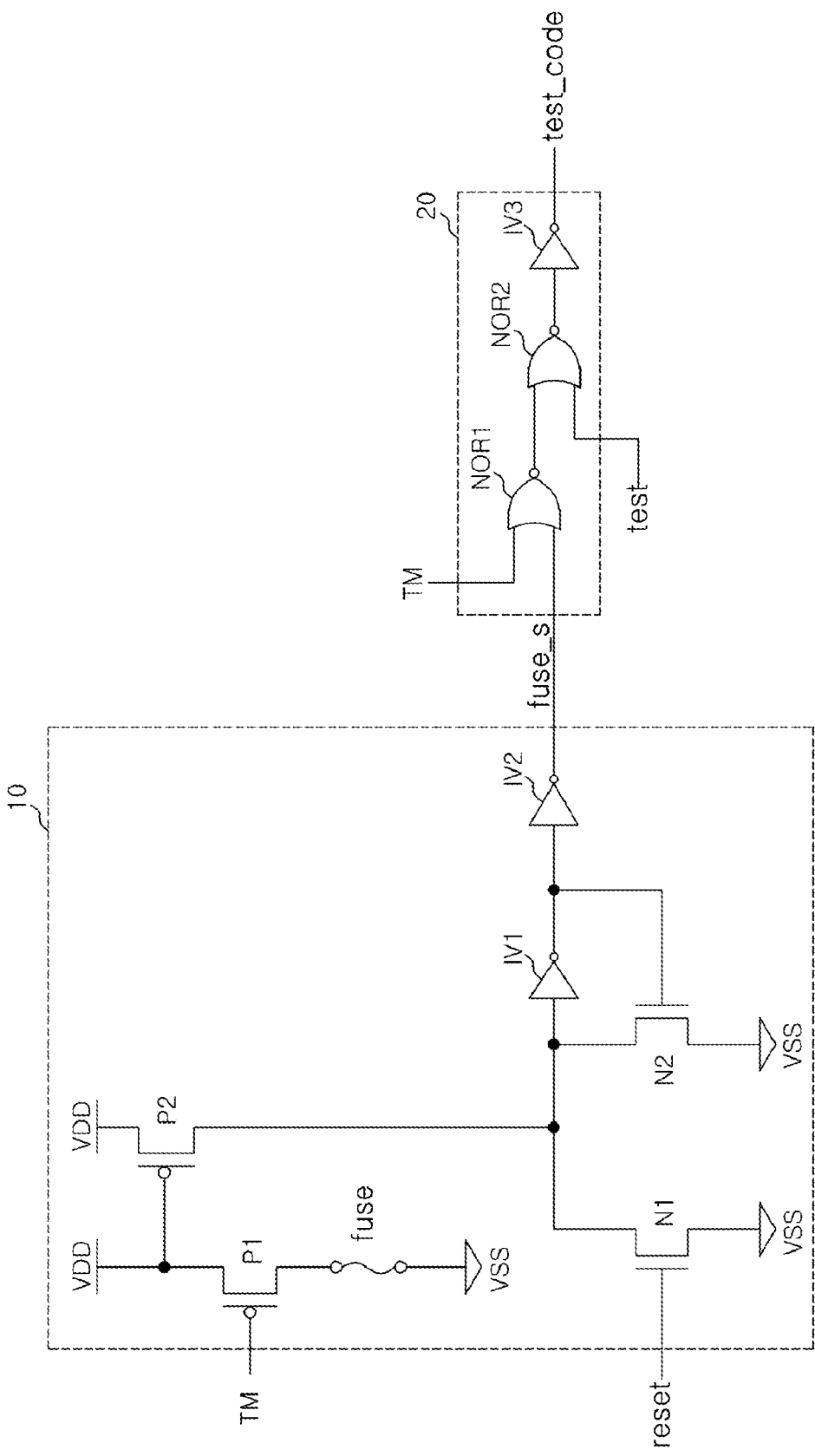
FIG. 1 is a detailed circuit diagram illustrating a conventional test apparatus.
Figure 2:
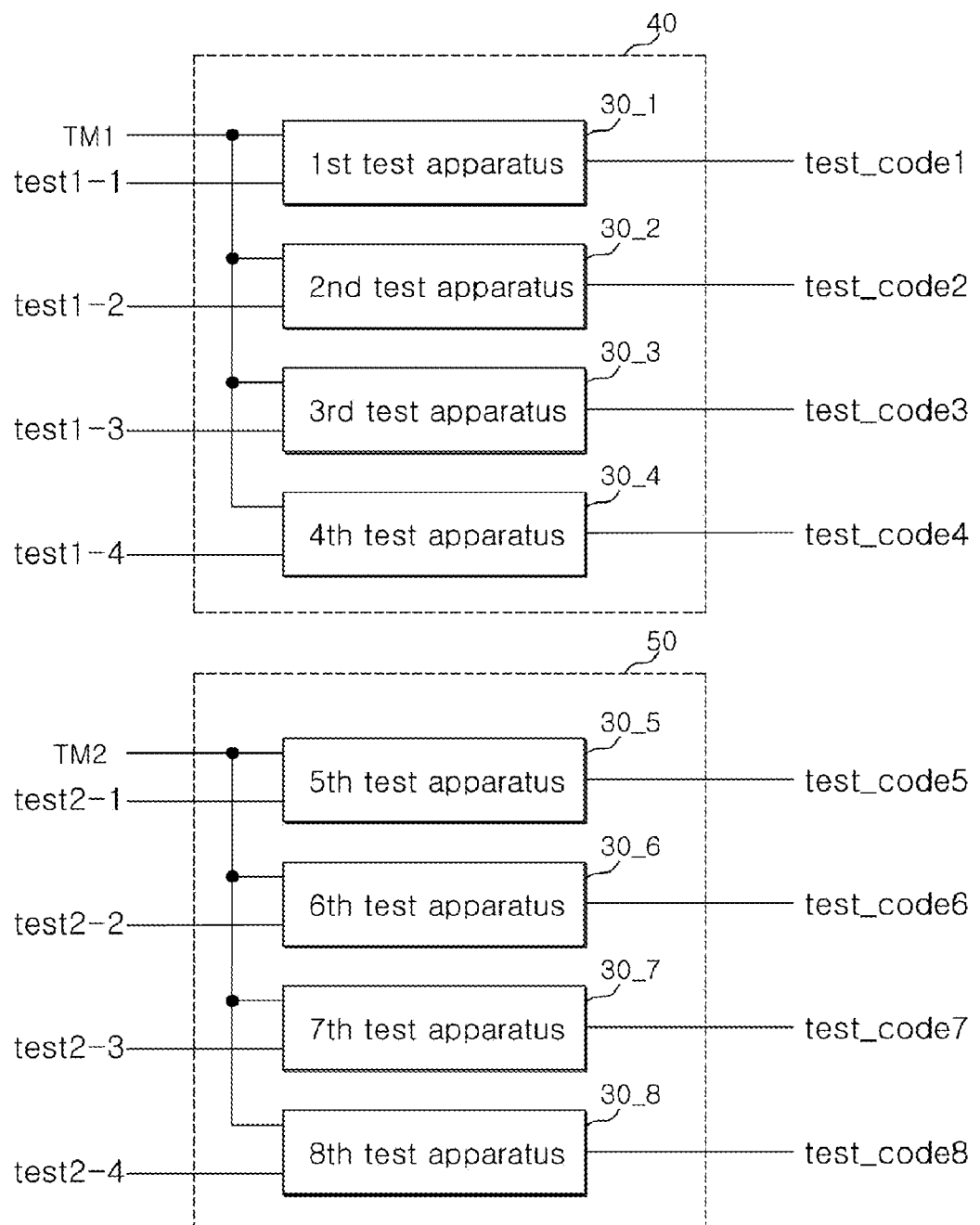
FIG. 2 is a schematic diagram illustrating a semiconductor integrated circuit that includes the conventional test apparatus of FIG. 1.
Figure 3:
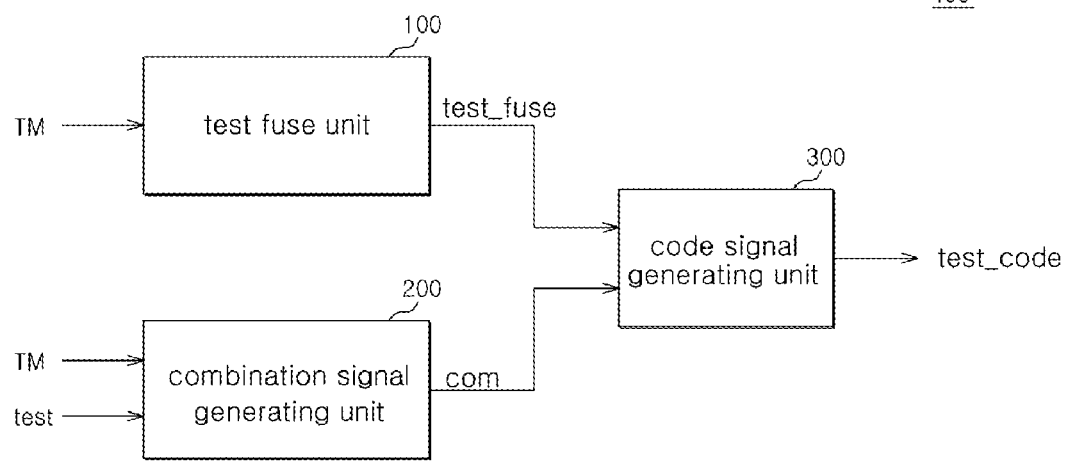
FIG. 3 is a schematic diagram illustrating a test apparatus of a semiconductor integrated circuit according to one embodiment.

As shown in FIG. 3, a test apparatus 400 configured according to the embodiments described herein can include a test fuse unit 100, a combination signal generating unit 200, and a code signal generating unit 300.

The test fuse unit 100 can be configured to generate a test fuse signal 'test_fuse' in response to a test mode signal 'TM' during a test. Furthermore, the test fuse unit 100 can also be configured to generate the test fuse signal 'test_fuse' based on whether a fuse is cut after the termination of the test. For example, when the test mode signal 'TM' is activated, the test fuse unit 100 can deactivate the test fuse signal 'test_fuse' and, when the test mode signal 'TM' is deactivated, the test fuse unit 100 can activate the test fuse signal 'test_fuse'. On the other hand, after the termination of the test, the test fuse unit 100 deactivates the test fuse signal 'test_fuse' if the fuse is not cut and activates the test fuse signal 'test_fuse' if the fuse is cut.

When the test mode signal 'TM' is deactivated, the combination signal generating unit 200 stores a test signal 'test' and deactivates a combination signal 'com'. When the test mode signal 'TM' is activated, the combination signal generating unit 200 outputs the combination signal 'com' using the stored test signal.

When either the test fuse signal 'test_fuse' or the combination signal 'com' is activated, the code signal generating unit 300 activates a test code signal 'test_code'.

The test fuse unit 100 can be configured to generate the test fuse signal 'test_fuse' in response to the test signal 'test' when a test is initiated and generate a test fuse signal 'test_fuse' based on the status of the fuse after the termination of the test.

Figure 4:
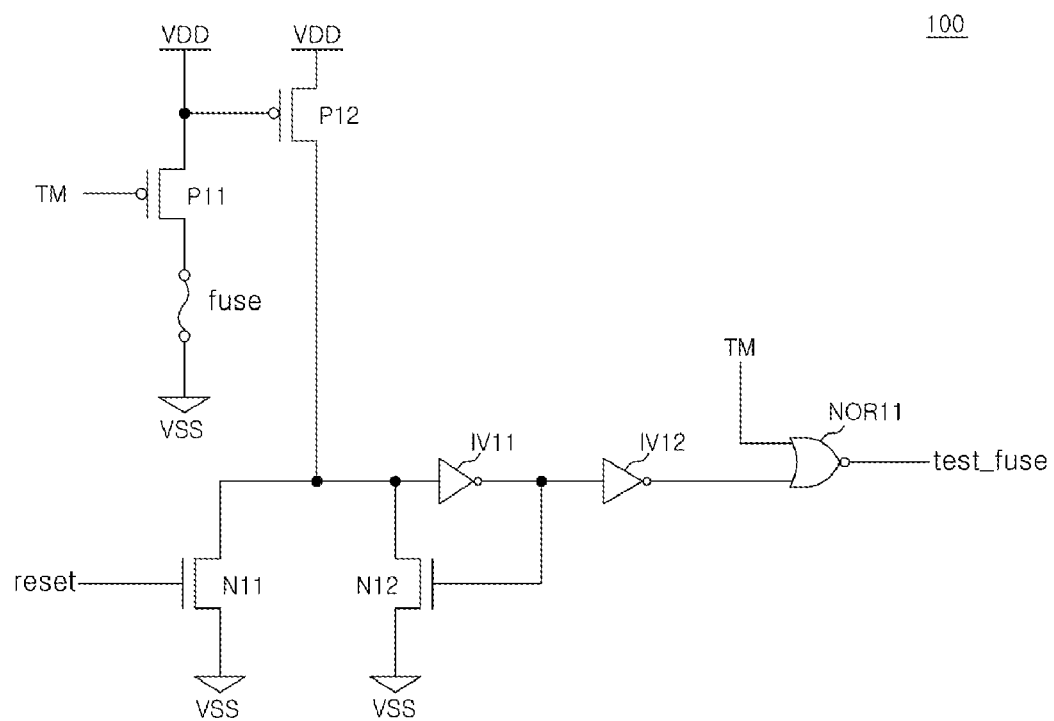
FIG. 4 is a detailed circuit diagram illustrating a test fuse unit that can be included in the test apparatus of FIG. 3.

As shown in FIG. 4, the test fuse unit 100 can include first to fourth transistors P11, P12, N11 and N12, first and second inverters IV11 and IV12, and a first NOR gate NOR11. The first transistor P11 can have a gate to which the test mode signal 'TM' is applied and a source to which an external power supply voltage VDD is applied. The fuse can be provided between a drain of the first transistor P11 and a ground voltage terminal VSS. The second transistor P12 can have a gate connected to the source of the first transistor P11 and a source to which the external power supply voltage VDD is applied. The third transistor N11 can have a drain connected to a drain of the second transistor P12, a gate to which a reset signal 'reset' is applied, and a source connected to the ground voltage terminal VSS. The fourth transistor N12 can have a drain connected to the drain of the second transistor P12 and a source connected to the ground voltage terminal VSS. The drain of the fourth transistor N12 can be connected to an input terminal of the first inverter IV11 and the gate of the fourth transistor N12 can be connected to an output terminal of the first inverter IV11. The second inverter IV12 can receive an output of the first inverter IV11 and then output an inverted signal. The first NOR gate NOR11 can receive the test mode signal 'TM' and an output signal of the second inverter IV12 and then output the test fuse signal 'test_fuse'.

The reset signal 'reset' can be a pulse signal that is activated when the test mode signal 'TM' transitions to a different voltage level or the fuse is cut.

The test fuse unit 100 can be configured to output the test fuse signal 'test_fuse' at a low level when the test mode signal 'TM' is activated, e.g., at a high level and the fuse is not cut. Furthermore, the test fuse unit 100 can be configured to output the test fuse signal 'test_fuse' at a high level when the test mode signal 'TM' is deactivated, e.g., at a low level, and the fuse is not cut.

When the test mode is terminated so that the test mode signal 'TM', e.g., transitions to a low level, the test fuse unit 100 can be configured to deactivate the test fuse signal 'test_fuse', e.g., generate the test fuse signal 'test_fuse' at a low level, when the fuse is not cut. Also, when the test mode is terminated, the test fuse unit 100 can be configured to activate the test fuse signal 'test_fuse', e.g., generate the test fuse signal 'test_fuse' at a high level, when the fuse is cut.

Figure 5:
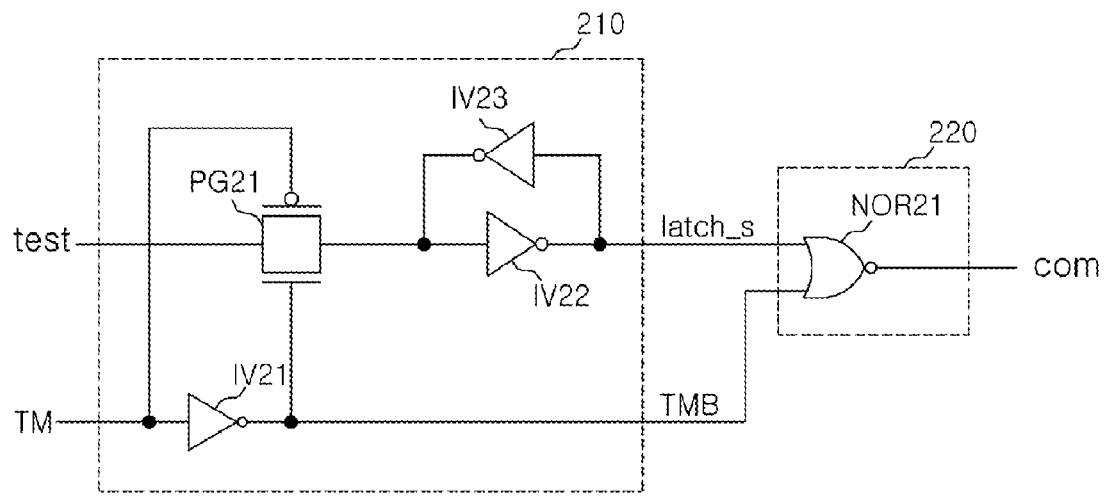
FIG. 5 is a detailed circuit diagram illustrating a combination signal generating unit that can be included in the test apparatus of FIG. 3.

As shown in FIG. 5, the combination signal generating unit 200 can include a latch unit 210 and a combination unit 220. When the test mode signal 'TM' is deactivated, e.g., at a low level, then the latch unit 210 can receive and store the test signal 'test' and then invert the test signal 'test'. When the test mode signal 'TM' is activated, e.g., at a high level, the latch unit 210 will not receive the test signal 'test'.

The latch unit 210 can include a pass gate PG21 and third to fifth inverters IV21 to IV23. The inverter IV21 can be configured to generate an inverted test mode signal TMB by inverting the test mode signal 'TM'. The pass gate PG21 can have a first control terminal to receive the test mode signal 'TM' and a second control terminal to receive an output signal of the third inverter IV21 and selectively transfer the test signal 'test' under the control of the first and second control terminals. The fourth inverter IV22 can receive an output of the pass gate PG21 and then output a latch signal 'latch_s'. The fifth inverter IV23 can have an input terminal connected to an output terminal of the fourth inverter IV22 and an output terminal connected to an input terminal of the fourth inverter IV22.

The combination unit 220 can be configured to generate the combination signal 'com', which can be activated only when both of the latch signal 'latch_s' and the inverted test mode signal 'TMB' are at a low level.

The combination unit 220 can include a NOR gate NOR21. The NOR gate NOR21 can be configured to receive the latch signal 'latch_s' and the inverted test mode signal 'TMB' and then output the combination signal 'com'.

Accordingly, when the test mode signal 'TM' is deactivated, e.g., at a low level, the combination signal generating unit 200 can be configured to generate the combination signal 'com' regardless of the latch signal 'latch_s'. At this time, since the pass gate PG21 is turned on, the combination signal generating unit 200 can store the test signal 'test' and the stored test signal 'test' can be output as the latch signal 'latch_s'. On the other hand, when the test mode signal 'TM' is activated, e.g., at a high level, the combination signal generating unit 200 can output the combination signal 'com' by inverting the stored test signal 'test'.

For example, when the test mode signal 'TM' is activated at a high level, the combination signal generating unit 200 can generate the combination signal 'com', which can be activated at a high level when the stored latch signal 'latch_s' is at a low level, and generate the combination signal 'com', which is deactivated at a low level, when the stored latch signal 'latch_s' is at a high level.

The code signal generating unit 300 can be configured to activate the test code signal 'test_code' when any one of the test fuse signal 'test_fuse' and the combination signal 'com' is activated.

Figure 6:
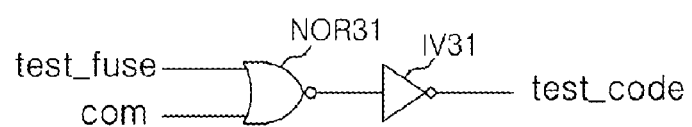
FIG. 6 is a detailed circuit diagram illustrating a code signal generating unit that can be included in the test apparatus of FIG. 3.

The code signal generating unit 300 can include a third NOR gate NOR31 and a sixth inverter IV31 as illustrated in FIG. 6. The third NOR gate NOR31 can be configured to receive the test code signal 'test_code' and the combination signal 'com'. The sixth inverter IV31 can receive an output of the third NOR gate NOR31 and then output the test code signal 'test_code'.

The operation of the test apparatus of the semiconductor integrated circuit 400 will now be described in detail.

First, the test fuse unit 100 outputs the test fuse signal 'test_fuse', which is deactivated at a low level, when the test mode signal 'TM' is activated at a high level. Meanwhile, the test fuse unit 100 outputs the test fuse signal 'test_fuse', which is activated at a high level, when the test mode signal 'TM' is deactivated at a low level.

When the test mode signal 'TM' is deactivated at a low level, the combination signal generating unit 200 receives the test signal 'test', stores it as the latch signal 'latch_s', and deactivates the combination signal 'com' at a low level. When the test mode signal 'TM' is activated at a high level, the combination signal generating unit 200 outputs the combination signal 'com' by inverting the latch signal 'latch_s'.

The code signal generating unit 300 activates the test code signal 'test_code' when any one of the test fuse signal 'test_fuse' and the combination signal 'com' is activated.

During a test, the test fuse signal 'test_fuse' is deactivated at a low level when the test mode signal 'TM' is activated at a high level. Accordingly, the activation or deactivation of the test code signal 'test_code' is determined by the test signal 'test'.

When the test is terminated, the combination signal 'com' is deactivated at a low level since the test mode signal 'TM' is deactivated at a low level. Accordingly, the activation or deactivation of the test code signal 'test_code' is determined by the status of the fuse.

Therefore, in the test apparatus 400, the voltage level of the test code signal 'test_code' is determined, at the time of test, by the test signal 'test' when test mode signal 'TM' is activated. Also, when the test is terminated, the voltage level of the test code signal 'test_code' is determined by the status of the fuse.

Figure 7:
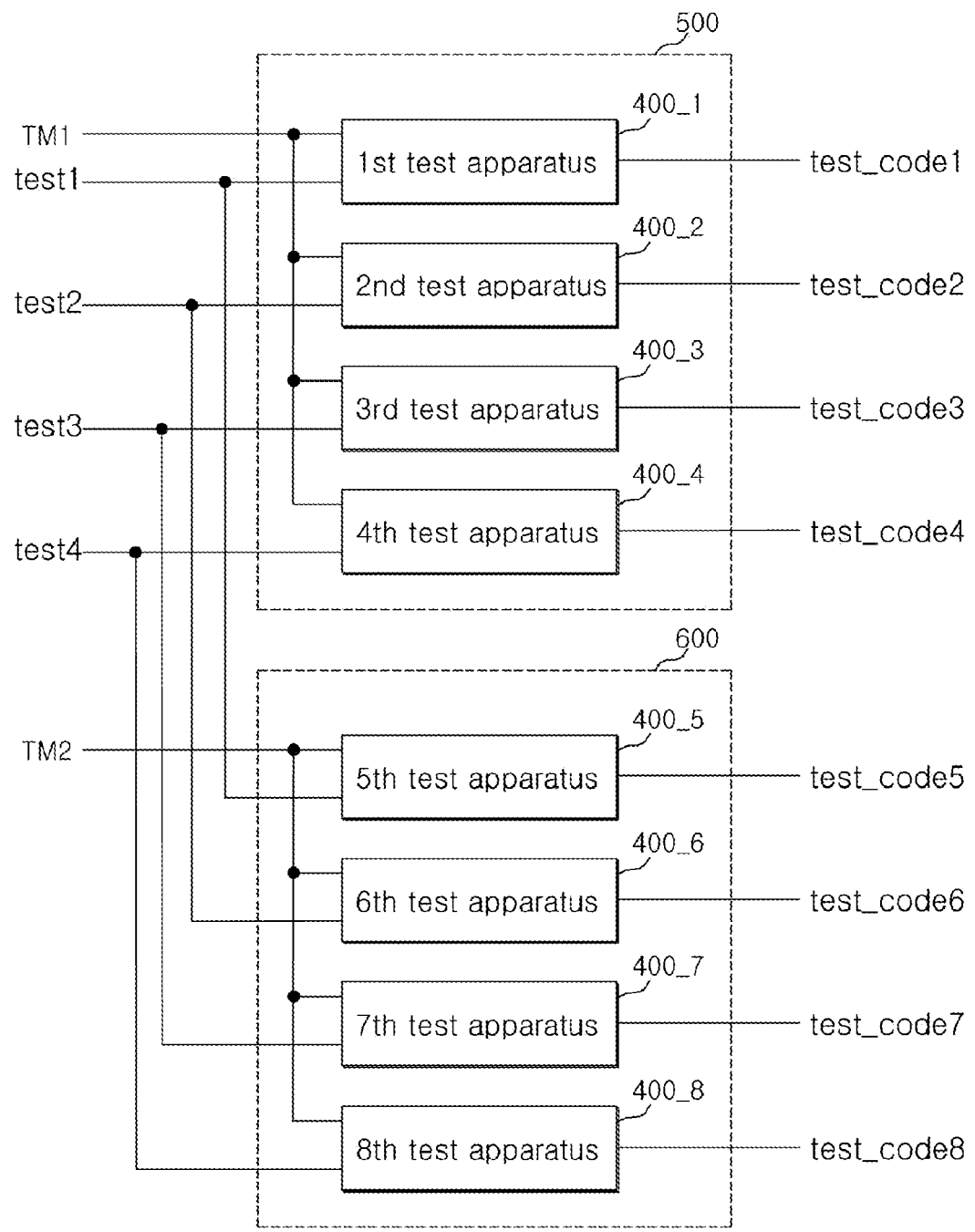
FIG. 7 is a schematic diagram illustrating a semiconductor integrated circuit that includes the test apparatus of FIG. 3.

As shown in FIG. 7, a semiconductor integrated circuit that includes the above-mentioned test apparatus can include a first test mode circuit 500 and a second test mode circuit 600.

The first test mode circuit 500 can include, e.g., first to fourth test apparatuses 400_1 to 400_4. The first test apparatus 400_1 can be configured to receive a first test mode signal 'TM1' and a first test signal 'test1' and then generate a first test code signal 'test_code1'. The second test apparatus 400_2 can be configured to receive the first test mode signal 'TM1' and a second test signal 'test2' and then generate a second test code signal 'test_code2'. The third test apparatus 400_3 can be configured to receive the first test mode signal 'TM1' and a third test signal 'test3' and then generate a third test code signal 'test_code3'. The fourth test apparatus 400_4 can be configured to receive the first test mode signal 'TM1' and a fourth test signal 'test4' and then generate a fourth test code signal 'test_code4'. At this time, the first to fourth test code signals 'test_code1' to 'test_code4' can be generated in order to execute a first test mode.

The second test mode circuit 600 can include fifth to eighth test apparatuses 400_5 to 400_8. The fifth test apparatus 400_5 can receive a second test mode signal 'TM2' and the first test signal 'test1' and then generate a fifth test code signal 'test_code5'. The sixth test apparatus 400_6 can receive the second test mode signal 'TM2' and the second test signal 'test2' and then generate a sixth test code signal 'test_code6'. The seventh test apparatus 400_7 can receive the second test mode signal 'TM2' and the third test signal 'test3' and then generate a seventh test code signal 'test_code7'. The eighth test apparatus 400_8 can receive the second test mode signal 'TM2' and the fourth test signal 'test4' and then generate an eighth test code signal 'test_code8'. At this time, the fifth to eight test code signals 'test_code5' to 'test_code8' can be generated in order to execute a second test mode.

The operation of the semiconductor integrated circuit of FIG. 7 will now be described in detail.

The first to fourth test signals 'test1' to 'test4' are set up for the first test mode and the first test mode signal 'TM1' is deactivated. If the first test mode signal 'TM1' is deactivated, then the first to fourth test signals 'test1' to 'test4' are stored in the first to fourth test apparatuses 400_1 to 400_4, respectively.

The first to fourth test signals 'test1' to 'test4' are set up for the second test mode and the second test mode signal 'TM2 is deactivated. If the second test mode signal 'TM2 is deactivated, then the first to fourth test signals 'test1' to 'test4' are stored in the fifth to eighth test apparatuses 400_5~400_8, respectively.

When the first test mode signal 'TM1' is activated, the first to fourth test signals 'test1' to 'test4', which are stored in the first to fourth test apparatuses 400_1 to 400_4, are output as the first to fourth test code signals 'test_code1' to 'test_code4', respectively.

When the second test mode signal 'TM21' is activated, the first to fourth test signals 'test1' to 'test4', which are stored in the fifth to eighth test apparatuses 400_5 to 400_8, are output as the fifth to eighth test code signals 'test_code5' to 'test_code8', respectively.

In case that four test signals are required to execute one test mode, the conventional semiconductor integrated circuit should have eight test signals for two test modes. However, in a semiconductor integrated circuit configured in accordance with the embodiments described herein, just four test signals are needed even though a plurality of test modes are executed. That is, the semiconductor integrated circuit having the test apparatus configured in accordance with the embodiments described herein executes the plurality of test modes using a constant number of test signals so that signal lines to transmit the test signals are reduced. As a result, the semiconductor integrated circuit configured in accordance with the embodiments described herein improves the area efficiency.

While certain embodiments have been described above, it will be understood that the embodiments described are by way of example only. Accordingly, the systems and methods described herein should not be limited based on the described embodiments. Rather, the systems and methods described herein should only be limited in light of the claims that follow when taken in conjunction with the above description and accompanying drawings.

What is claimed is:

1. A method for testing a semiconductor integrated circuit comprising:

storing a first test code in a first test apparatus through a signal line when a first test mode signal is deactivated;

outputting the first test code stored in the first test apparatus when the first test mode signal is activated;

storing a second test code in a second test apparatus through a signal line when a second test signal is deactivated; and outputting the second test code stored in the second test apparatus when the second test mode signal is activated.

2. The method of claim 1, wherein the outputting of the first test code includes separating the signal line from the first test apparatus when the first test mode signal is activated.

3. The method of claim 1, wherein the outputting of the second test code includes separating the signal line from the second test apparatus when the second test mode signal is activated.

4. A test apparatus of a semiconductor integrated circuit comprising:
   a plurality of signal lines;
   a first test apparatus coupled with the plurality of signal lines, the first test apparatus configured to store first test signals, which are input through the plurality of signal lines, in response to a first test mode signal, and output first test code signals, the first test code signals being applied before the first test mode signal; and
   a second test apparatus coupled with the plurality of signal lines, the second test apparatus configured to store second test signals, which are input through the plurality of signal lines, in response to a second test mode signal and output second test code signals, the second test code signals being applied before the second test mode signal.

5. The test apparatus of claim 4, wherein the first test apparatus is further configured to store the first test signals when the first test mode signal is deactivated and output the stored test signals as the first test code signals when the first test mode signal is activated.

6. The test apparatus of claim 5, wherein the first test apparatus is further configured to generate the first test code signals according to a fuse status.

7. The test apparatus of claim 6, wherein the first test apparatus includes:
   a test fuse unit configured to generate test fuse signals according to the first test mode signal and the fuse status;
   a combination signal generating unit configured to store the first test signals when the first test mode signal is deactivated and output the stored first test signals as combination signals when the first test mode signal is activated; and
   a code signal generating unit configured to generate the first test code signals in response to the test fuse signals and the combination signals.

8. The test apparatus of claim 7, wherein the test fuse unit is further configured to deactivate the test fuse signal when the first test mode signal is activated, and activate the test fuse signals when the first test mode signal is deactivated during a test, and wherein the test fuse unit is further configured to deactivate the test fuse signal when associated fuses are not cut and activate the test fuse signals when associated fuses are cut after the termination of the test time.

9. The test apparatus of claim 7, wherein the combination signal generating unit includes:

a latch unit configured to store the first test signals as latch signals when the first test mode signal is deactivated; and
a combination unit configured to generate the combination signals in response to the latch signals when the first test mode signal is activated and deactivate the combination signals when the first test mode signal is deactivated.

10. The test apparatus of claim 7, wherein the code signal generating unit is further configured to activate the first test code signals when the test fuse signals or the combination signals are activated.

11. The test apparatus of claim 4, wherein the second test apparatus is further configured to store the second test signals when the second test mode signal is deactivated and output the stored test signals as the second test code signals when the second test mode signal is activated.

12. The semiconductor integrated circuit of claim 11, wherein the second test apparatus is further configured to generate the second test code signals according to a fuse status.

13. The test apparatus of claim 12, wherein the second test apparatus includes:
   a test fuse unit configured to generate test fuse signals according to the second test mode signal and the fuse status;
   a combination signal generating unit configured to store the second test signals when the second test mode signal is deactivated and output the stored second test signals as combination signals when the second test mode signal is activated; and
   a code signal generating unit configured to activate the second test code signals in response to the test fuse signals and the combination signals.

14. The test apparatus of claim 13, wherein the test fuse unit is further configured to deactivate the test fuse signal when the second test mode signal is activated, and activate the test fuse signals when the second test mode signal is deactivated during a test time, and wherein the test fuse unit is further configured to deactivate the test fuse signal, when associated fuses are not cut, and activate the test fuse signals when associated fuses are cut after the termination of the test.

15. The test apparatus of claim 13, wherein the combination signal generating unit includes:
   a latch unit configured to store the second test signals as latch signals when the second test mode signal is deactivated; and
   a combination unit configured to generate the combination signals in response to the latch signals when the second test mode signal is activated and deactivate the combination signals when the second test mode signal is deactivated.

16. The test apparatus of claim 13, wherein the code signal generating unit is further configured to activate the second test code signals when the test fuse signals or the combination signals are activated.

* * * * *